(12) United States Patent
Stewart

(10) Patent No.: US 7,593,822 B2
(45) Date of Patent: *Sep. 22, 2009

(54) BATTERY MONITOR

(75) Inventor: Roger Green Stewart, Morgan Hill, CA (US)

(73) Assignee: Stragent, LLC, Longview, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/622,415

(22) Filed: Jan. 11, 2007

(65) Prior Publication Data

US 2007/0118309 A1    May 24, 2007

Related U.S. Application Data

(63) Continuation of application No. 11/124,487, filed on May 6, 2005.

(51) Int. Cl.
G01R 31/36 (2006.01)
(52) U.S. Cl. ...................................................... 702/63
(58) Field of Classification Search ............. 702/60–63, 702/75, 78, 79; 340/572.1, 636.1; 455/130; 320/127, 134, 137
See application file for complete search history.

(56) References Cited

U.S. PATENT DOCUMENTS

| | | | | |
|---|---|---|---|---|
| 5,065,084 A | * | 11/1991 | Oogita | 320/136 |
| 5,455,499 A | * | 10/1995 | Uskali et al. | 340/636.1 |
| 5,487,178 A | * | 1/1996 | Hanninen | 455/67.14 |
| 5,592,095 A | * | 1/1997 | Meadows | 324/436 |
| 6,952,157 B1 | * | 10/2005 | Stewart et al. | 340/10.2 |
| 7,145,437 B2 | * | 12/2006 | Jalkanen et al. | 340/10.3 |
| 7,394,238 B2 | * | 7/2008 | Ochiai et al. | 324/76.35 |
| 2003/0169703 A1 | | 9/2003 | Tamura | 370/320 |
| 2004/0008123 A1 | * | 1/2004 | Carrender et al. | 340/825.49 |
| 2005/0121526 A1 | * | 6/2005 | Stewart et al. | 235/492 |
| 2005/0123133 A1 | * | 6/2005 | Stewart et al. | 380/46 |
| 2006/0250220 A1 | * | 11/2006 | Stewart | 340/10.4 |
| 2006/0265181 A1 | * | 11/2006 | Stewart | 702/178 |
| 2007/0001816 A1 | * | 1/2007 | Lindley et al. | 340/10.34 |
| 2007/0085677 A1 | * | 4/2007 | Neff et al. | 340/539.22 |

OTHER PUBLICATIONS

International Search Report from related application No. PCT/US2006/08322 which was mailed on Feb. 9, 2007.
International Written Opinion from related application No. PCT/US2006/08322 which was mailed on Feb. 9, 2007.
Office Action Summary from U.S. Appl. No. 11/124,487 mailed on Aug. 26, 2008.
Office Action Summary from U.S. Appl. No. 11/124,487 mailed on Dec. 16, 2008.

* cited by examiner

Primary Examiner—Michael P Nghiem

(57) ABSTRACT

Circuit and methods for tracking the total amount of time that a host device has spent in its high power "activated" state (and optionally idle and hibernate states) and thereby can estimate the total power consumed by the host device. A value representing this time may be send to a remote device to, for example, accurately determine how much of the energy has been consumed by the host device and how much time is left and/or how many operations can be performed before the host device's battery is exhausted.

20 Claims, 5 Drawing Sheets

BATTERY MONITOR

RELATED APPLICATIONS

This application is a continuation of U.S. patent application Ser. No. 11/124,487, filed May 6, 2005. The present application is also related to U.S. patent application Ser. No. 11/124,485, entitled "ACCURATE PERSISTENT NODES" and filed May 6, 2005, and which is incorporated by reference.

FIELD OF THE INVENTION

The present invention relates to power consumption monitoring circuitry, and more particularly, this invention relates to circuits that monitor power consumption in a host device.

BACKGROUND OF THE INVENTION

Radio Frequency Identification (RFID) technology employs a radio frequency ("RF") wireless link and ultra-small embedded computer circuitry. RFID technology allows physical objects to be identified and tracked via these wireless "tags". It functions like a bar code that communicates to the reader automatically without requiring manual line-of-sight scanning or singulation of the objects. RFID promises to radically transform the retail, pharmaceutical, military, and transportation industries.

Several advantages of RFID technology are summarized in Table 1:

Table 1

Identification without visual contact
Able to read/write
Able to store information in tag
Information can be renewed anytime
Unique item identification
Can withstand harsh environment
Reusable
High Flexibility/Value As shown in FIG. 1, a basic RFID system 100 includes a tag 102, a reader 104, and an optical server 106. The tag 102 includes an integrated circuit (IC) chip and an antenna. The IC chip includes a digital decoder needed to execute the computer commands the tag 102 receives from the tag reader 104. The IC chip also includes a power supply circuit to extract and regulate power from the RF reader, a detector to decode signals from the reader; a back-scattering modulator to send data back to the reader; anti-collision protocol circuits; and at least enough EEPROM memory to store its EPC code.

Communication begins with a reader 104 sending out signals to find the tag 102. When the radio wave hits the tag 102 and the tag 102 recognizes the reader's signal, the reader 104 decodes the data programmed into the tag 102. The information can then be passed to a server 106 for processing, storage, and/or propagation to another computing device. By tagging a variety of items, information about the nature and location of goods can be known instantly and automatically.

The system uses reflected or "backscattered" radio frequency (RF) waves to transmit information from the tag 102 to the reader 104. Since passive (Class-1 and Class-2) tags get all of their power from the reader signal, the tags are only powered when in the beam of the reader 104.

The Auto ID Center EPC-Compliant tag classes are set forth below:

Class-1
  Identify tags (RF user programmable, maximum range ~3 m)
Class-2
  Memory tags (8 bits to 128 Mbits programmable at maximum ~3 m range)
  Security & privacy protection
Class-3
  Battery tags (256 bits to 64 Kb)
  Self-Powered Backscatter (internal clock sensor interface support)
  ~100 meter range
Class-4
  Active tags
  Active transmission (permits tag-speaks-first operating modes)
  Up to 30,000 meter range In RFID systems where passive receivers (i.e., Class-1 tags) are able to capture enough energy from the transmitted RF to power the device, no batteries are necessary. In systems where distance prevents powering a device in this manner, an alternative power source must be used. For these "alternate" systems (also known as active or semi-passive), batteries are the most common form of power. This greatly increases read range, and the reliability of tag reads, because the tag doesn't need power from the reader. Class-3 tags only need a 10 mV signal from the reader in comparison to the 500 mV that a Class-1 tag needs to operate. This 2,500:1 reduction in power requirement permits Class-3 tags to operate out to a distance of 100 meters or more compared with a Class-1 range of only about 3 meters.

One concern with powered tags is the life of the battery. Battery-powered RFID tags draw very little power when silent, but draw orders of magnitude more power when active. If the tag has been forced into activated states many times, the battery will be used up more quickly than a tag activated less. Because certain tags are active more often than others, it is hard to estimate the battery life of a tag. The current method is to replace all tags when the battery on one of the tags dies, as it is likely others will die soon as well. However, many other tags may still have a long life remaining. Thus it would be desirable to estimate the remaining life of a battery in an RFID tag.

SUMMARY OF THE INVENTION

A circuit tracks the total amount of time that a host device such as an RFID tag has spent in its high power "activated" state (an optionally idle and hibernate states) and thereby can estimate the total power consumed by the tag. A remote device such as an RFID reader can query the state of a counter storing a value representing this time to accurately determine how much of the energy has been consumed by the tag and how much time is left and/or how many more operations can be performed before the tag's battery is exhausted. The circuit includes oscillators wherein the speed (e.g., frequency) of the oscillators is controlled by reference currents and current mirrors. The circuits may also include fixed-frequency ultra-low power oscillators with multiple or variable frequency dividers that can divide the fixed-frequency output by varying amounts depending on whether or not the tag is in a higher-power activate state, a lower-power inactive state, or other power state. The battery monitor circuit is designed to consume only a small fraction of the power of the chip itself so as not to significantly shorten the battery life of the tag.

In one embodiment, a counter circuit includes an ultra low power oscillator that initiates when the tag wakes up, runs when the tag is active, and stops when the tag turns off. The oscillator count is then added to a value in a register. The reader can interrogate the register storing the count and estimate how much life is left in the battery, such as by comparing the count to a benchmark count.

Optionally, the oscillator can run during the tag's inactive states, thereby keeping track of total time.

In another embodiment, a second oscillator is run during tag inactive state to estimate off-time usage. Note that this may require a second register to store the counts from the second oscillator. Then the reader can query the registers and estimate the remaining battery life using both active and inactive times.

In a further embodiment, the system has one clock that is run at two different speeds, or a varying speed based on power consumption. In the former case, the clock runs at a fast speed when the tag is active and at a slow speed when the tag is inactive. In the latter case, the clock runs proportional to power dissipation. The more power being used, the faster the clock cycle (higher count). When the tag is idling or hibernating, the clock runs more slowly. In any case, the reader can compare the total count to a benchmark value representing tag life. For instance, the reader can use an experimental average life count of, say 7 million, and compare it to the total count in the tag to estimate remaining battery life.

In another embodiment, a host RFID device includes a subsystem for estimating power consumption thereof, the subsystem comprising: a mechanism for tracking at least an amount of time the RFID device is in an active state; and a mechanism for generating a value representing at least the amount of time the RFID device is in the active state based on the tracking. The host RFID device also includes a mechanism for sending the value or derivative thereof to a remote device.

In yet another embodiment, a host RFID device includes a subsystem for estimating power consumption thereof, the subsystem comprising: a mechanism for tracking at least an amount of time the RFID device is in an active state; and a mechanism for generating a value representing at least the amount of time the RFID device is in the active state based on the tracking.

A method for estimating power consumption according to one embodiment includes tracking an amount of time a host Radio Frequency Identification (RFID) device is in an active state; generating a value representing the amount of time the host RFID device is in the active state; and sending the value to a remote device.

A system for estimating power consumption of a host device according to a further embodiment includes an oscillator for tracking at least an amount of time a host device is in a first state; a counter receiving output from the oscillator for generating a value representing a power consumption of the host device based on output from the oscillator, wherein the counter operates at different speeds depending on the state of the host device, wherein the host device has a battery, wherein the host device calculates an estimation of a remaining battery life of the host device based on the power consumption value.

A method for estimating power consumption of a host RFID device according to yet another embodiment, includes generating a first tracking signal at a first frequency when a host RFID device is in a first state; generating a second tracking signal at a second frequency when the host RFID device is in a second state different than the first state; and processing the tracking signals for generating a value representing a power consumption of the host RFID device, wherein a derivative of the value is generated for output to a user.

A method for estimating power consumption of a host RFID device according to a still further embodiment includes generating a tracking signal at a constant frequency when a host RFID device is in a first or second state; dividing the frequency of the tracking signal when the host RFID device is in the second state; and storing a count of the frequency, wherein a derivative of the value is generated for output to a user.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

The following specification describes systems and methods for tracking the total amount of time that a host device spends in a high-power "Active" state and optionally, low-power state(s), to thereby allow estimation of the total power consumed by the host device. Active states can include those states where the device is actively using power, or where power consumption is above what would be considered a low-power state. Note that the host device can have multiple active states, and operation of the system can vary for each active state. Low power states typically include "hibernate", "idle", or "wait/listen for an activation command" states. A remote device can query the device to accurately determine how much of the battery energy has been consumed by the host device, how much life is left in the battery, and/or how many more operations can be performed before the host device's battery is exhausted.

Figure 1:
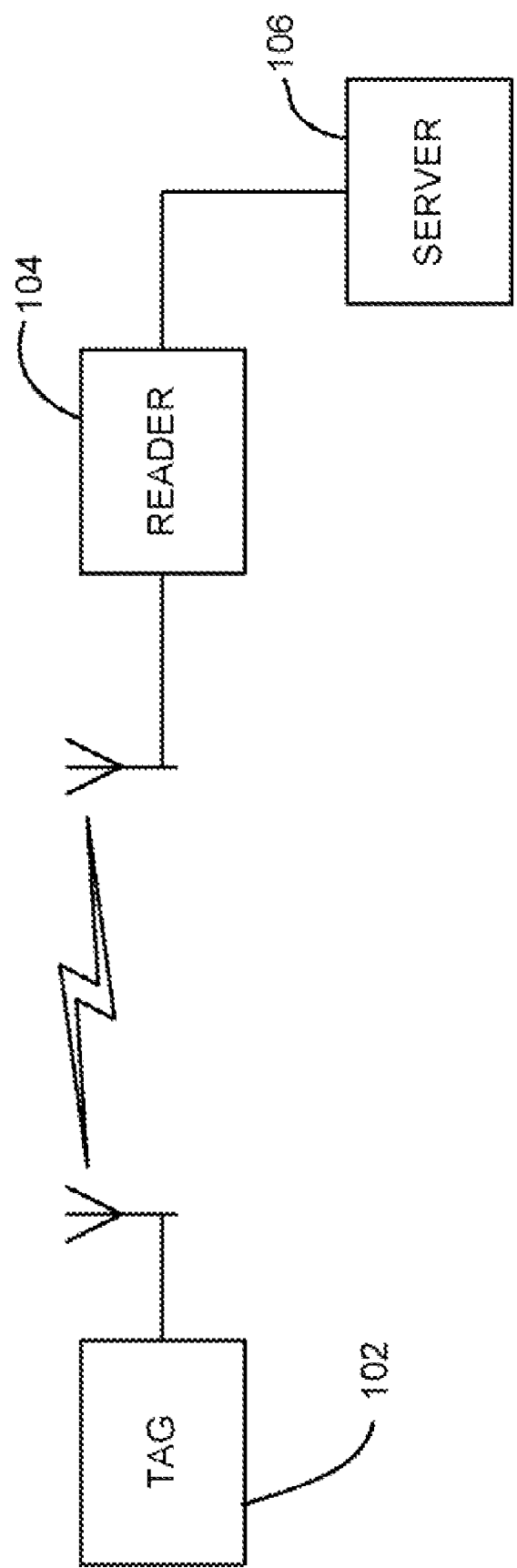
FIG. 1 is a system diagram of an RFID system.

Many types of devices can take advantage of the embodiments disclosed herein, including but not limited to Radio Frequency Identification (RFID) systems and other wireless devices/systems; pacemakers; portable electronic devices; remote controllers for televisions, audio devices, and other electronic devices; smoke detectors; etc. To provide a context, and to aid in understanding the embodiments of the invention, much of the present description shall be presented in terms of an RFID system such as that shown in FIG. 1. It should be kept in mind that this is done by way of example only, and the invention is not limited to RFID systems, as one skilled in the art will appreciate how to implement the teachings herein into electronic devices in hardware and/or software. Examples of hardware include Application Specific Integrated Circuits (ASICs), printed circuits, monolithic circuits, reconfigurable hardware such as Field Programmable Gate Arrays (FPGAs), etc. Further, the methodology disclosed herein can also be incorporated into a computer program product, such as a computer disc containing software. Further, such software can be downloadable or otherwise transferable from one computing device to another via network, nonvolatile memory device, etc.

Figure 2:
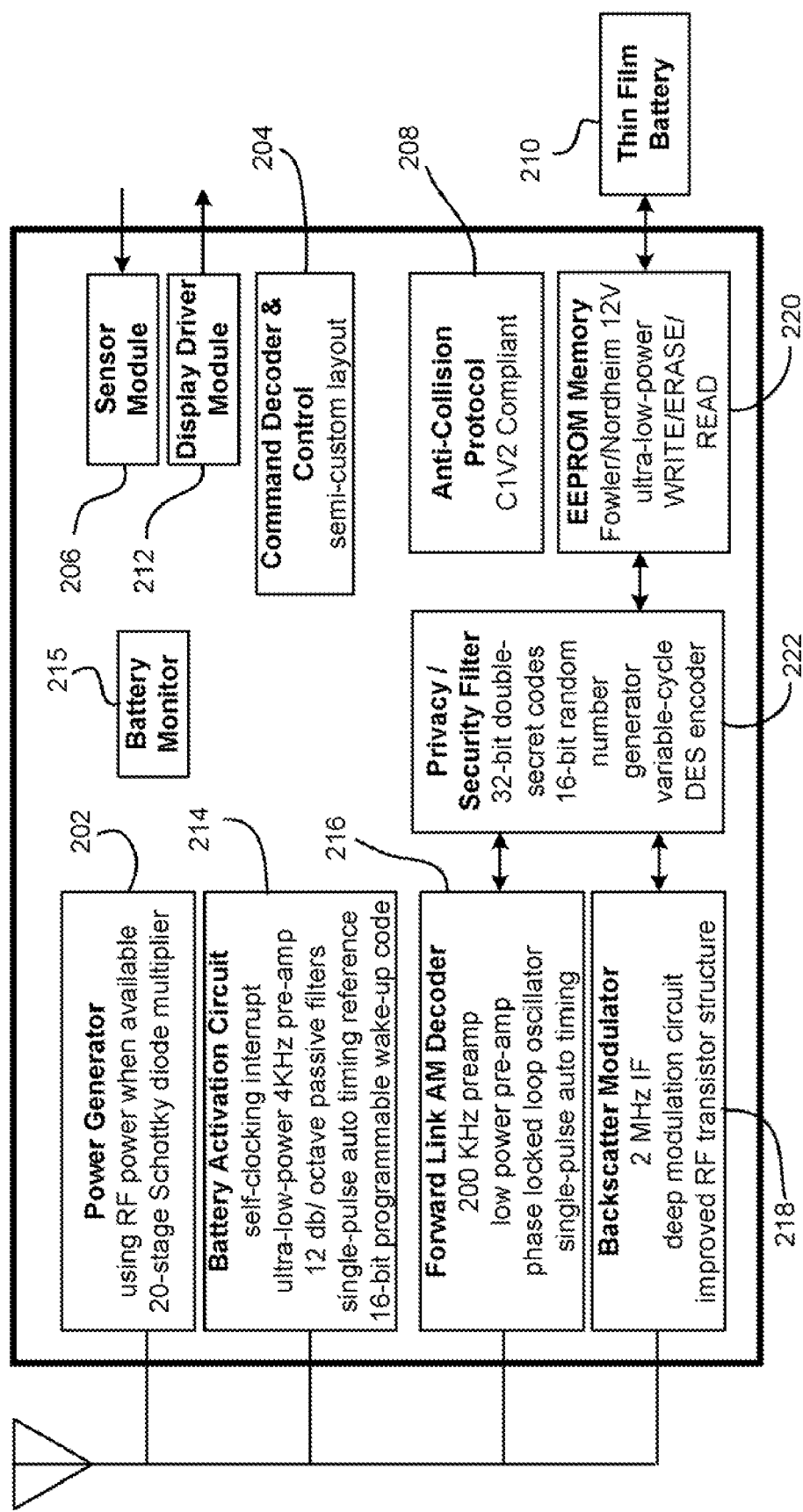
FIG. 2 is a system diagram of an integrated circuit (IC) chip for implementation in an RFID tag.

A preferred embodiment is preferably implemented in a Class-3 or higher Class RFID tag, but will function with any type of module or class of RFID tag. FIG. 2 depicts a circuit layout of a Class-3 module 200 according to a preferred embodiment for implementation in an RFID tag, and is presented by way of example only. This Class-3 module can form the core of RFID modules appropriate for many applications such as identification of pallets, cartons, containers, vehicles, or anything where a range of more than 3 meters is desired. As shown, the module 200 includes several industry-standard circuits including a power generation and regulation circuit 202, a digital command decoder and control circuit 204, a sensor interface module 206, a C1V2 interface protocol circuit 208, and a power source (battery) 210. A display driver module 212 can be added to drive a display.

A battery activation circuit 214 is also present to act as a wake-up trigger. The battery activation circuit 214 includes with an ultra-low-power, narrow-bandwidth preamplifier. The battery activation circuit 214 also includes a self-clocking interrupt circuit and may use an innovative 32-bit user-programmable digital wake-up code as described in U.S. patent application entitled "BATTERY ACTIVATION CIRCUIT" and having Ser. No. 11/007,973, filed on Dec. 8, 2004, and which is herein incorporated by reference. The battery activation circuit 214 draws less power during its sleepless state and is much better protected against both accidental and malicious false wake-up trigger events that otherwise would lead to pre-mature exhaustion of the Class-3 tag battery 210.

A battery monitor 215 monitors power usage in the device. The information collected can then be used to estimate a useful remaining life of the battery.

A forward link AM decoder 216 uses a simplified phase-lock-loop oscillator that requires an absolute minimum amount of chip area. Preferably, the circuit 216 requires only a minimum string of reference pulses.

A backscatter modulator block 218 preferably increases the backscatter modulation depth to more than 50%.

A pure, Fowler-Nordheim direct-tunneling-through-oxide mechanism 220 is present to reduce both the WRITE and ERASE currents to less than 0.1 µA/cell in the EEPROM memory array. This will permit designing of tags to operate at maximum range even when WRITE and ERASE operations are being performed.

The module 200 also incorporates a highly-simplified, yet very effective, security encryption circuit 222 as described in U.S. patent application entitled "SECURITY SYSTEM AND METHOD" and having Ser. No. 10/902,683, filed on Jul. 28, 2004 and which is herein incorporated by reference.

Sensors to monitor temperature, shock, tampering, etc. can be added by appending an industry-standard I2C interface to the core chip.

Extremely low-cost Class-2 security devices can be built by simply disabling or removing the wake-up module, pre-amplifiers, and IP modules from the Class-3 module core.

Several embodiments are described below with reference to specific speeds (frequencies), voltages, amperages, etc. to exemplify the preferred low power aspects of the embodiments. It should be kept in mind that these are provided by way of example only, and any suitable speed (frequency), voltage, amperage, etc. can be used, as will be apparent to one skilled in the art.

Figure 3:
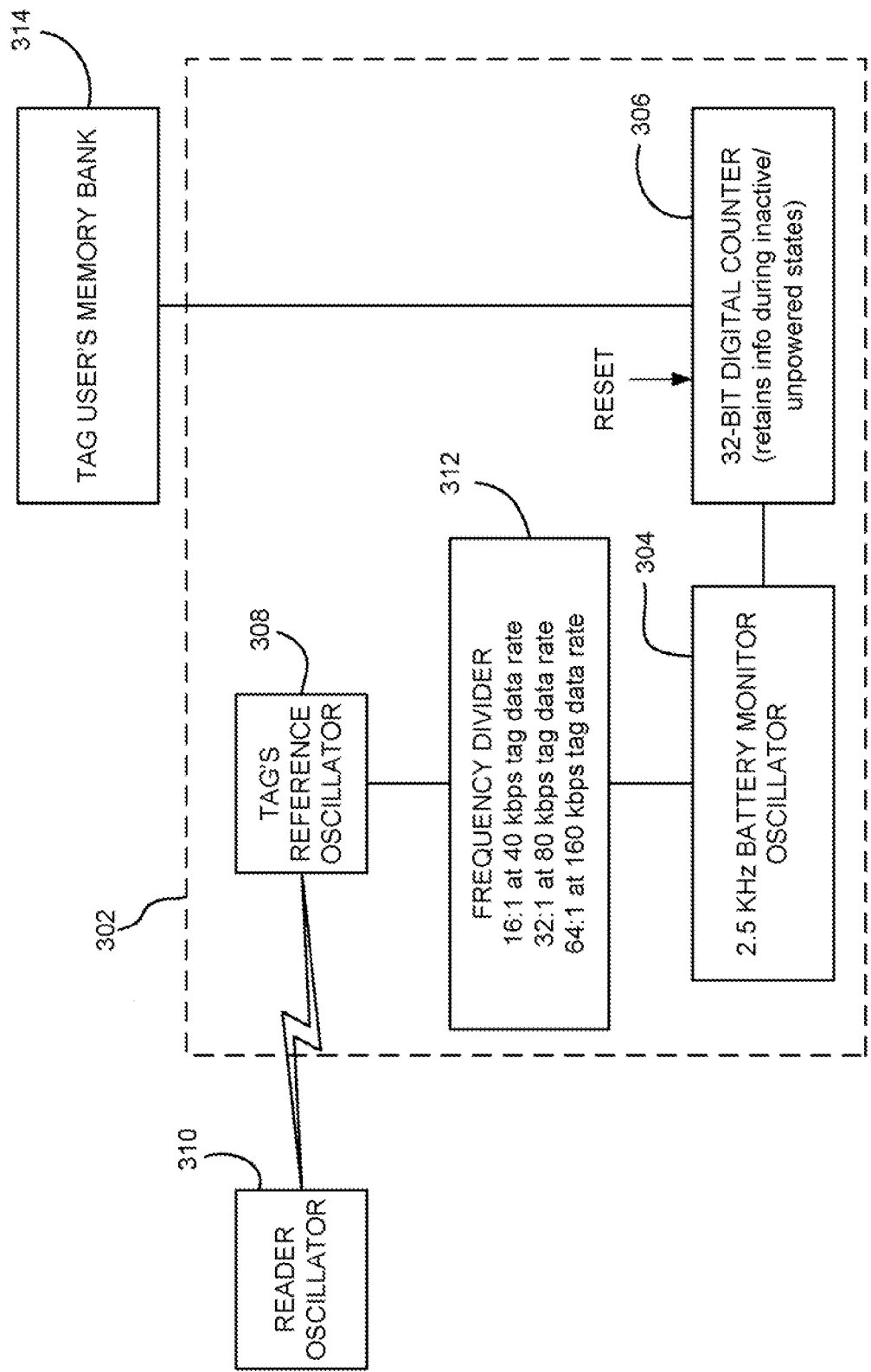
FIG. 3 is a system diagram of a system that provides intermittent battery monitoring.

Intermittent Battery Monitoring:

FIG. 3 illustrates one embodiment of a system 300 having an RFID tag battery monitor 302 in which a mechanism, e.g., dedicated oscillator 304, tracks the total amount of time that the tag has spent in its high-power "Activated" state. Another mechanism, e.g., counter 306, generates a value based on the tracking, where the value can thereby be used to estimate the total power consumed by the tag. A remote device such as a reader (see FIG. 1) can query the state of this counter 306 to accurately determine how much of the battery energy has been consumed by the tag, how much life is left in the battery and/or how many more operations can be performed before the tag's battery is exhausted.

In a simple embodiment, the battery monitor oscillator 304 operates only when the tag is active. In this circuit 300, the battery monitor oscillator 304 is, using a frequency divider 312, divided down by the ratio of 16.1 from the tag's internal oscillator 308 (typically a 40 KHz oscillator that might be used in the C1G2 specification) that the tag uses to parse and decode data it receives from the reader. In this way, the battery monitor oscillator 304 operates accurately at 2.5 KHz since the frequency is ultimately derived from the reader's oscillator 310 or accurately generated on the RFID chip to an accuracy of better than ±15%. If the tag is commanded by the reader to download data at a faster rate than 40 Kbps, then the tag may increase the divider ratio for the battery monitor 302 above 16.1 (as shown in FIG. 3) to make sure the battery monitor oscillator 304 continues to run at 2.5 KHz. In this way, the battery monitor oscillator 304 can provide a consistent tracking of the battery usage, regardless of data speed.

The battery monitor oscillator 304 drives the "Battery Monitor Counter" 306 that increments when the oscillator 304 is running and continues to store the current cumulative count during periods when the tag is inactive or unpowered. The contents of the battery monitor counter 306 can be read in a pre-assigned location of the optional user memory bank 314 of the tag. In this example, the oscillator 304 drives the counter 306 at 2.5 KHz. The counter 306 is preferably at least 32-bits long to make sure it never overruns its storage limit, but only the state of the 16 MSBs have to be addressable by the reader.

The divider 312 and the resulting slow 2.5 KHz oscillation frequency of the battery monitor oscillator 304 ensure that the power dissipation of the battery monitor circuit 302 is negligible compared to the rest of the active power dissipation of the tag. Typical power dissipation will be only a few nano-amperes.

Those skilled in the art may replace the simple digital frequency divider 312 with current mirrors and reference current sources. In a similar manner, the battery monitor 302 need not operate at a fixed frequency but may be made to vary in proportion with the variations in the power dissipation of the RFID chip assuming that the power dissipation may vary as a function of the forward data rate, whether the tag is writing data to memory or not, whether or not the tag is operating a sensor, etc.

In a variation on the above, a second oscillator can be run during other tag states to estimate off-time usage. Note that this may require a second register to store the counts from the second oscillator. Then the reader can query both registers and estimate the remaining battery life using both active and inactive times.

Figure 4:
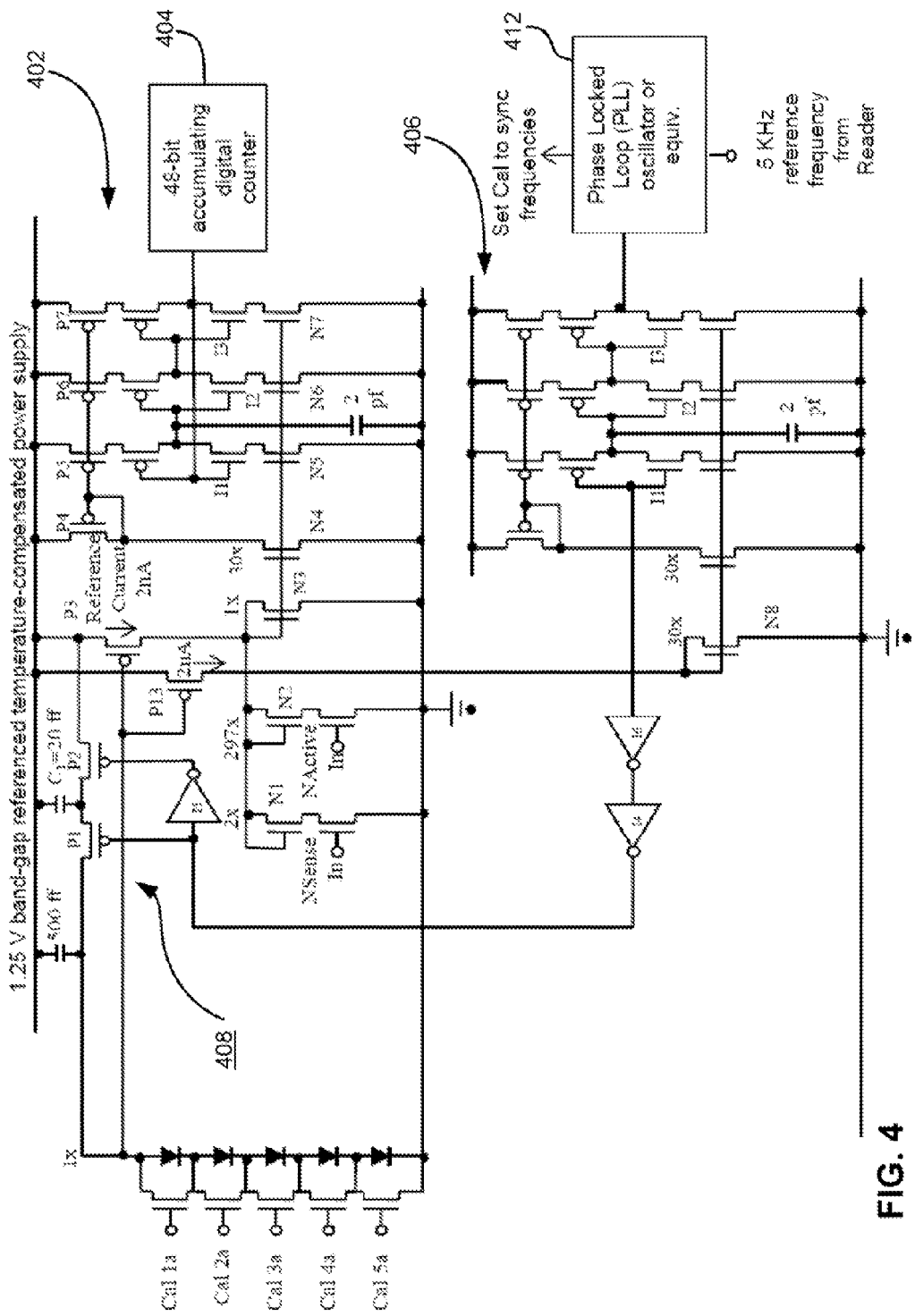
FIG. 4 is a circuit diagram of a circuit for continuous battery monitoring.

Continuous Battery Monitoring with Analog Control:

In a more complex illustrative embodiment shown in FIG. 4, a tag battery monitor 400 may also include a fixed-frequency ultra-low-power oscillator 402 with multiple or variable frequency dividers that can divide the fixed-frequency output by varying amounts depending on whether or not the tag is in a higher-power activate state, a low-power inactive state, or other power states. As in the circuit 302 of FIG. 3, the battery monitor circuit 400 of FIG. 4 is designed to consume only a small fraction of the power of the chip itself so as not to significantly shorten the battery life of the tag.

In this illustrative embodiment, assume the RFID tag contains a temperature sensor and supports 3 different operating modes:
 a hibernate or "inactive" mode in which it consumes only 0.1 µA in power;
 an "activated" mode in which it exchanges data with the reader and consumes 10 µA
 a "sense" mode in which it takes and records a temperature reading and consumes 30 µA While the amount of time the tag will spend in each of these modes varies widely, the circuit 400 monitors the time spent in each mode and accumulates the effect this will have on battery life.

The circuit shown in FIG. 4 contains a precision calibrated Ultra-Low-Power ("ULP") oscillator 402 that runs at a frequency rate of only about 500 Hz and consumes only about 3 nA of power. This oscillator 402 can run continuously which permits more accurate measurement of power consumption since it now monitors and measures inactive "hibernate" power consumption in addition to the active power consumption measured in FIG. 3. Addition of the ULP oscillator 402 also facilitates other important tag functions like enabling a real time clock, enabling logging of temperature and other sensor data, etc.

The ULP oscillator 402 in this embodiment consists of a Voltage Controlled Oscillator ("VCO") formed with three inverters (I1, I2, I3) connected with feedback to form a ring oscillator. The frequency of this oscillator is controlled by matched pairs of current mirrored transistors P5/N5, P6/N6, P7/N7, and a capacitor connected to the output of I1. The current flowing in these transistors is in turn controlled both by the "2 nA reference current" flowing in P3 and the analog current multiplier circuit formed by N1, N2, N3, and N4.

In the lowest-power "Inactive" mode, the tag is neither in the "Sense" nor "Active" state, and the negative-sense inputs "NSense" and "NActive" are both high. This effectively connects transistors N1, N2, and N3 in parallel at the drain of N3 for a total conductivity of 1×+2×+297×=300×. The "1×" or "297×" here refers to the relative "size", "conductivity", or more accurately "$g_m$" of the transistors. Following standard current-mirror design practice, the effective mirror ratio is now 30×/300× which sets the currents flowing through P4 and N4 (plus each the other current mirrored transistor pairs P5/N5, P6/N6, and P7/N7) at 0.2 nA. An additional 2 pf of low-leakage non-junction capacitance is also added to the output of inverter I1 to reduce the oscillator frequency to about 500 Hz. Note that in this "inactive" mode the power dissipation of this entire battery monitoring circuit totals only about 5 nA, which is much less than the power consumed by the tag itself.

However, when the tag enters the "active" state, transistor N2 is disconnected from the mirror circuit. This changes the current multiplier ratios as follows: the total conductivity is now 3×(1×+2×), the ratio is now 30×/3×, the P4 current has increased to 20 nA, and the VCO oscillator frequency has increased from 500 Hz to 50 KHz. Note that when the tag power dissipation increased 100× from 0.1 µA to 10 µA, the battery monitor circuit responded by increasing the counter frequency by 100× also. Also, note that although the monitor power dissipation increased to about 0.1 µA, it remains less than 1% of the total power dissipation of the chip itself.

Finally, when the tag enters the highest-power "sensor" state, transistors N2 and N3 are both disconnected from the mirror circuit. This changes the current multiplier ratios as follows: the total conductivity is now only 1×, the ratio is now 30×/1×, the P4 current has increased to 60 nA, and the VCO oscillator frequency has increased to 150 KHz. Note that when the tag power dissipation increased 300× from 0.1 µA to 30 µA, the battery monitor circuit responded by increasing the counter frequency by 300× also. Also, note that although the monitor power dissipation increased to about 0.3 µA, it remains less than 1% of the total power dissipation of the chip itself. It is well known to those skilled in the state of the art that well-designed VCO oscillators like the one shown in FIG. 4 or described in U.S. Pat. No. 4,236,199, can be accurately controlled over frequency ranges of 10,000:1 or more.

A Calibrated Ultra-Low-Power Current Source:

While the preceding discussion shows how the battery monitor circuit will work with a 2 nA reference current source, no such current sources have ever existed in the IC chip world. For example, just trying to scale a conventional PMOS transistor to source only this much current (with it's gate grounded and it's source at 1.2V) would require the channel length to be scaled to over 100,000 microns—hardly a practical design. And in any case, the accuracy and stability of any 2 nA current source would be extremely poor without a method for accurately calibrating this current. FIG. 4 therefore includes a practical circuit for generating and calibrating the 2 nA current source. Again, it should be stressed that the 2 nA current source specification is by way of example only, and higher and lower currents can be used with the circuit.

In FIG. 4, the calibrated current source is controlled by a replica of the first VCO that is used to drive the accumulating counter 404, except that this reference VCO 406 runs at a constant frequency independently of the Activate or Sense modes of operation. In this example the VCO 406 operates at 5000 Hz, but again, it could operate at either a higher or lower frequency. The output of the reference VCO 406 is buffered and clipped to form a square wave and used to drive P1 and P2. P1, P2 and their associated capacitors form a "switched capacitor" precision resister 408. The bias current flowing though this network is nominally: 1=(C1)×(f)×(ΔV)=20 ff×500 Hz×0.5V=50 pA. Nominally, this 50 pA bias current also flows through the calibration matrix and induces an offset voltage across the calibration matrix of 0.75V—assuming that 3 of the bypass calibration transistors are turned off. With a nominal P threshold voltage of 0.44V, then both P3 and P13 will be biased at exactly 0.01 V above their thresholds and will in theory each inject exactly 2 nA into the circuit.

In practice P3 and P13 (and the other mirrored transistors in the circuit) can operate either just above or below their respective threshold voltages, i.e. both can be operated in their sub-threshold region if necessary to keep the reference current low. Also in practice none of these nominal variables are well controlled, so without calibration, the resulting reference currents and oscillation frequencies might vary greatly from their nominal values due to variations in threshold voltage, temperature, and sub-threshold characteristics of both the diodes and transistors.

Accurate calibration of the current source and the oscillator frequency is therefore achieved as follows. The reader issues a "Calibration" command and sends a 5000 Hz reference tone to the tag. The tag uses a simple PLL circuit 412 to compare the reader reference frequency with it's own reference oscillator frequency and adjusts the 5 digital inputs to the calibration matrix as necessary to force it's own reference oscillator frequency to match that of the reader. Once set, the digital calibration settings are permanently stored in memory, e.g., either EEPROM or static RAM until a reader tells the tag to re-calibrate itself.

Figure 5:
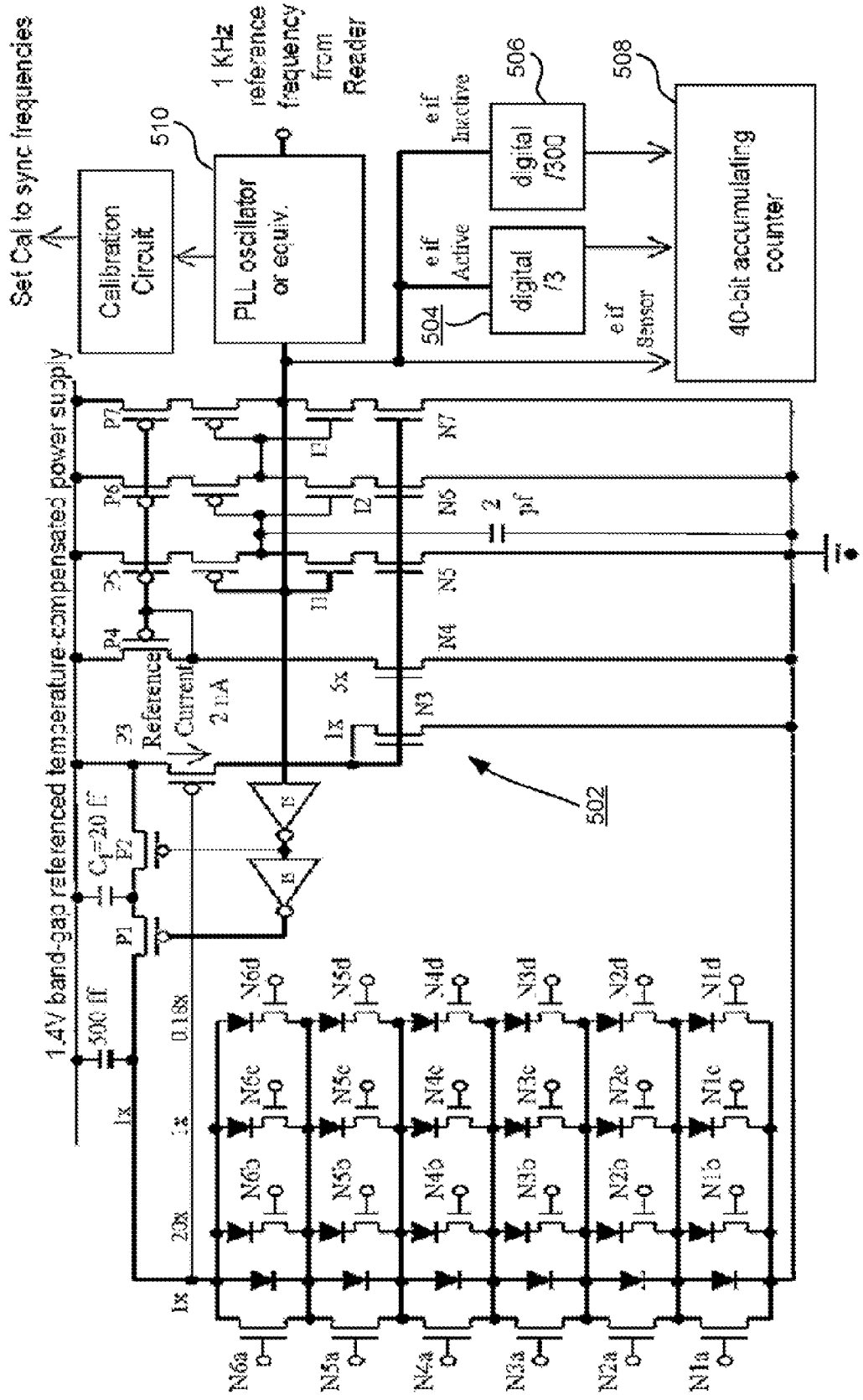
FIG. 5 is a circuit diagram of a circuit for continuous battery monitoring with automatic calibration.

The calibration matrix shown in FIG. 4 is digitally adjustable. The nominal maximum voltage across the calibration matrices is 1.25 V (250 mV forward bias at 50 pA for each "1×-sized" diode). Coarse adjustments of about 250 mV are made by shorting out completely one or more of the "Cal" diodes. As shown in FIG. 5, the circuit of FIG. 4 can be extended as necessary to provide digital adjustments as fine as 1 mV.

Continuous Battery Monitoring with Digital Control:

FIG. 5 shows another embodiment 500 of the invention including a single calibrated ULP oscillator 502 running at 1 KHz and two digital dividers 502, 506 to monitor time in each of the three illustrative tag power modes (Inactive, Active, Sensor) and to total the cumulative impact of operating in each of these modes on the remaining battery capacity. When operating in the "Inactive" mode the 1 KHz oscillator output is divided 300:1 before the output is fed into the 40-bit accumulating counter 508. In the "Active" mode the reference oscillator is divided 3:1, and in the "Sensor" mode it passes directly to the accumulating counter 508. In this circuit 500, changes to the reference oscillator frequency are minimized, and a constant 10 pA bias current passes through P1 and P2 to the calibration matrix.

Auto-Calibration:

The calibration matrix shown in FIG. 5 is digitally adjustable with a combination of both fine and coarse adjustment bits. In this example, use of an ultra-low-bias current of only about 10 pA reduces the offset voltage across the parallel combinations of the four diodes (a,b,c,d which total 22.1× in size) to only about 200 mV. In one preferred embodiment, the tag will calibrate itself with the following simplified algorithm.

Initially, all 24 of the calibration transistors are turned on and the calibration matrix is shorted out completely. The tag reference frequency will then initially exceed that of the reader reference frequency and this fact is directed by the PLL oscillator 510 shown in FIG. 5. In response, the calibration logic starts turning off each of the N1a, N2a, N3a . . . transistors in sequence until the PLL detects that the tag frequency has dropped below that of the reader reference oscillator (or until N1a through N6a are all off). Each disconnected "a-series" transistor increases the voltage to the gate of P3 by 200 mV. If and when the PLL detects that the tag frequency has dropped below the reader reference frequency of 1000 Hz, the calibration circuit turns the last two "a-series" transistors that it had switched off, back on. The "a-series" coarse calibration sequence is now complete.

Next, the tag begins the "b-series" calibration sequence by turning off each of the N1b, N2b . . . transistors in sequence until the PLL detects that the tag frequency has dropped below that of the reader reference oscillator (or until N1b through N6b are all off). Each disconnected "b-series" transistor decreases the size of the diode from 22.18× to 2.18×, and this increases the voltage to the gate of P3 by 60 mV. This is because the forward-current/junction-area of the diode is an exponential function of the forward voltage with a slope of about 60 mV/decade at room temperature. If and when the PLL detects that the tag frequency has dropped below the reader reference frequency of 1000 Hz, the calibration circuit turns the last two "b-series" transistors that it had switched off, back on. The "b-series" calibration sequence is now complete.

Next, the tag begins the "c-series" calibration sequence by turning off each of the N1c, N2c . . . transistors in sequence until the PLL detects that the tag frequency has dropped below that of the reader reference oscillator (or until N1c through N6c are all off). Each disconnected "c-series" transistor decreases the size of the diode from 2.18× to 1.18×, and this increases the voltage to the gate of P3 by 20 mV, based on the equation $\Delta V = (\log_{10} 2.1/1.18)(60 \text{ mv/decade}) = 20 \text{ mV}$. As before, if and when the PLL detects that the tag frequency has dropped below the reader reference frequency of 1000 Hz, the calibration circuit turns the last "c-series" transistor that it had switched off, back on. The "c-series" calibration sequence is now complete.

Finally, the tag begins the "d-series" calibration sequence by turning off each of the N1d, N2d . . . transistors in sequence until the PLL detects that the tag frequency has dropped below that of the reader reference oscillator. Each disconnected "d-series" transistor decreases the size of the diode from 1.18× to 1.0×, and this increases the voltage to the gate of P3 by 5 mV, based on the following equation:

$$\Delta V \times (\log_{10} 1.1/1.0)(60 \text{ mv/decade}) = 5 \text{ mV}$$

The calibration circuit then stops and locks the digital inputs to each of the calibration transistors in either EEPROM or static memory until the tag receives another "Calibration" command from the reader. The full auto-calibration sequence is now complete.

If necessary, even finer adjustments could be made by connecting even more diodes of different sizes in parallel thereby controlling the forward drop by increments as small as 1 mV. The net effect is to adjust the voltage across the calibration matrix such that at the nominal 10 pA bias current, there is just the right combination of diodes so that the input voltage to P3 is exactly what is necessary to produce the 2 nA reference current. The negative feedback employed during the calibration sequence ensures the the tag will calibrate itself accurately despite the variability in threshold voltages, leakage currents, etc.

Once calibrated, the bias voltage on the gate of P3 is maintained by negative feedback through P1 and P2. If, for example, the P3 gate voltage were to decrease, then the current through P3 would increase and the reference frequency would also increase. This would increase the current flowing through P1 and P2 which would fully restore the P3 gate voltage to the original value set by the calibration sequence.

While circuits like those shown in FIGS. 4 and 5 can achieve initial frequency and current calibration accuracies of better than ±10%, this accuracy may be degraded by changes in temperature or by subsequent variations in the power supply voltage. The best results are achieved by minimizing the variability of the power supply voltage using either a bandgap regulator or a battery power supply. In addition, the regulated power supply could compensate for both the temperature effect on the threshold voltage of P3/P13 and for the 2 mV/degree variation of the calibration diodes. If necessary, the accuracy can also be further improved by periodic re-calibration of the tag.

Additional Consideration:

To estimate the remaining life of the tag, the reader can query the tag for the value stored in the counter (or derivative of the value) and compare that value (or derivative thereof) to a benchmark value representing tag life or battery life. For instance, the reader can use an experimental average life count of, say 7 million, and compare it to the value in the counter to estimate power usage and remaining battery life.

If the user changes the tag battery, the count can be reset from the reader. Or the count can automatically reset if a battery is removed and replaced. The reader can send an alert by email, integrated display screen, computer link, etc. if a tag life is nearing its end. Similarly, the tag can include an integrated display screen, activated at user request, to show an estimated power consumption/life remaining.

Note that the method and circuit herein could also apply to measuring the service life of the tag, measuring tag activity, estimating a remaining useful life of the tag (e.g., if the circuitry is prone to a limited lifetime), etc.

There have thus been described circuits and systems that permit accurate monitoring of the total charge consumed by an IC chip and thereby permit one to accurately predict the end of life of the battery. In addition, there has been described an accurate calibrated ULP oscillator that can operate continuously at power levels as low as 3 nA, and frequencies in the range of 10 Hz to 100 KHz without the use of external capacitors or other external components.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for indicating power consumption of a host Radio Frequency Identification (RFID) device, comprising:
   generating a tracking signal at a constant frequency when the host RFID device is in a first or second state;
   dividing the frequency of the tracking signal when the host RFID device is in the second state,
   reducing consumption of power when the RFID device is in the second state; and
   storing an indication of the divided frequency,
   wherein a derivative of the indication is generated for output to a user for indicating the power consumption of the RFID device.

2. The method of claim 1, wherein the first state is an active state.

3. The method of claim 1, wherein the second state is a low-power state.

4. The method of claim 3, wherein the low-power state is a hibernate state.

5. The method of claim 3, wherein the low-power state is an idle state.

6. The method of claim 3, wherein the low-power state is a wait/listen for an activation command state.

7. The method of claim 1, wherein the RFID device includes an RFID tag.

8. The method of claim 1, wherein the tracking signal or derivative thereof is capable of being used by a remote device to determine how much life is left in a battery.

9. The method of claim 1, wherein the tracking signal or derivative thereof is capable of being used by a remote device to determine how much battery energy has been consumed by the RFID device.

10. The method of claim 1, wherein the tracking signal or derivative thereof is capable of being used by a remote device to determine how many more operations can be performed before a RFID device battery is exhausted.

11. The method of claim 1, wherein the tracking signal tracks a time spent in the first state.

12. The method of claim 1, wherein the frequency is reduced to zero.

13. The method of claim 1, wherein the RFID device includes a temperature sensor.

14. The method of claim 1, wherein the frequency is reduced by division.

15. The method of claim 1, wherein a counter is utilized for indicating the power consumption of the RFID device.

16. The method of claim 15, wherein a value stored in the counter or derivative of the value is compared to a benchmark value.

17. The method of claim 16, wherein the value stored in the counter is reset after a battery is changed.

18. The method of claim 1, wherein an alert is generated if a battery level falls below a predetermined amount.

19. The method of claim 1, wherein the tracking signal is used.

20. The method of claim 1, wherein the derivative is used.

* * * * *